United States Patent [19]

Bock et al.

[11] Patent Number: 5,389,605
[45] Date of Patent: Feb. 14, 1995

[54] PROCESS FOR MOLDING A HIGH-TEMPERATURE SUPERCONDUCTOR

[75] Inventors: Joachim Bock; Preisler Eberhard, both of Erftstadt, Germany

[73] Assignee: Hoechst Aktiengesellschaft, Frankfurt am Main, Germany

[21] Appl. No.: 67,725

[22] Filed: May 26, 1993

[30] Foreign Application Priority Data

Jun. 10, 1992 [DE] Germany ............... 4218950

[51] Int. Cl.$^6$ .................. H01L 39/12; B28B 1/02
[52] U.S. Cl. ..................... 505/450; 264/82; 264/310; 264/311; 264/332; 505/500
[58] Field of Search ............... 505/1, 739, 742, 782, 505/450, 500; 264/82, 104, 311, 332, 310

[56] References Cited

U.S. PATENT DOCUMENTS

| 5,047,391 | 9/1991 | Bock et al. ............... 505/1 |
| 5,215,961 | 6/1993 | Rayne et al. ............. 505/1 |

FOREIGN PATENT DOCUMENTS 0462409 12/1991 European Pat. Off. .
3830092 3/1990 Germany .

OTHER PUBLICATIONS

Patent Abstracts of Japan vol. 16, No. 219 May 22, 1992.

*Primary Examiner*—Christopher A. Fiorilla
*Attorney, Agent, or Firm*—Connolly and Hutz

[57] ABSTRACT

In a process for producing a high-temperature superconductor from oxides of bismuth, strontium, calcium, copper and optionally of lead and including sulfates of strontium and/or barium, the oxides of bismuth, strontium, calcium, copper and optionally of lead in the desired molar ratio, and from 2 to 30% by weight of strontium sulfate and/or from 1 to 20% by weight of barium sulfate, each calculated according to the mixture of the oxides, are mixed intimately, the mixture is melted in a crucible of a platinum metal at temperatures from 870° to 1600° C., the melt is poured into permanent molds of desired form and size and is allowed to solidify slowly therein, and the moldings produced are freed from the permanent mold material and are annealed for from 6 to 200 hours at temperatures from 700° to 900° C. in an oxygen-containing atmosphere.

5 Claims, No Drawings

PROCESS FOR MOLDING A HIGH-TEMPERATURE SUPERCONDUCTOR

The invention relates to a process for producing a high-temperature superconductor and moldings formed therefrom, comprising oxides of bismuth, strontium, calcium, copper and optionally of lead as well as sulfates of strontium and/or barium.

DE 38 30 092 A1 discloses a process for producing a high-temperature superconductor (HTSC) of the composition $Bi_2(Sr,Ca)_3Cu_2O_x$ with values for x from 8 to 10. In this process, stoichiometric mixtures of the oxides or carbonates of bismuth, strontium, calcium and copper are heated to temperatures from 870° to 1100° C. with the formation of a homogeneous melt. This melt is passed into permanent molds and slowly solidifies therein. The castings taken from the permanent molds are annealed for from 6 to 30 hours at from 780° to 850° C. and subsequently treated for at least 6 hours at from 600° to 830° C. in an oxygen-containing atmosphere. In this way it is possible to produce not only small samples, but also moldings of comparatively large dimensions, such as, for example, rods with lengths of up to 0.5 m, slabs with edge lengths of several cm and thicknesses of several mm or, by means of a variation of the process, centrifugal casting according to EP-0 462 409 A1, even to produce hollow cylinders, for example with a diameter of 20 cm and a height of 10 cm. Solid noble metal components can be integrated into said moldings or solid parts and, after temperature treatment, can be connected with the superconducting material in such a way that current contacts with very low contact resistances are produced.

Superconducting moldings of the type mentioned, with or without current contacts, will find future applications in the field of electrical engineering. One of the first applications will probably consist in current leads for low temperature superconductors. Replacing the conventional Cu leads used hitherto by HTSC ceramics would lead to considerably reduced consumption of helium as a coolant, since the thermal conductivity of the ceramics is considerably lower than that of metallic copper, and below the transition temperature in the superconductor no resistance losses will occur, which would otherwise lead to further heat input into the liquid helium.

Using new current leads instead of the conventional material therefore becomes the more rewarding, the higher the currents which are to be carried thereby. The precondition for this and for other applications of HTSC components in electrical engineering is the ability to carry currents in the order of magnitude of 1 kA.

A drawback in producing HTSC components by the process of DE 38 30 092 A1, which process comprises the casting of a homogeneous melt, hitherto consisted in the fact that the commercial corundum crucibles used for producing the homogeneous melt are strongly attacked by the bismuth-containing melts. In addition, the crucible material is stressed by the large temperature changes during the process: withdrawal of the crucible from the oven at 1000° C.

This results, firstly, in short service lives for the corundum crucibles. In some cases, after only 2 casts from a crucible, cracks are formed which do not permit further use of said crucibles, not least because of the necessary safe handling of the metal melts.

Even more serious is the fact that owing to the corrosion of the crucible, the HTSC material is contaminated by aluminum. Significant amounts of aluminum can be detected in the finished HTSC material. The proportions are typically at approximately 2000 ppm of Al, if melting is carried out for approximately 15 minutes at 1030° C. The values increase with increasing melting temperature and with prolonged dwell time in the molten state.

In order to increase the service lives of the crucibles and to minimize contamination by aluminum, the lowest possible melting temperature and the shortest possible selected melting duration are chosen. It is only possible to produce a melt which is only just pourable. This has additional drawbacks:

1. There is the risk that the melt is not completely homogeneous, but still contains solid starting components. This is the case, particularly, if the ratio of the alkaline earth metal content to the bismuth content is greater than 3 to 2, or if additives ($SrSO_4$, $BaSO_4$) are used. The main function of said additives is to prevent cracking in the ceramic moldings. Any segregations which occur in an uncontrolled manner and which are not superconducting in the finished superconducting material are not acceptable, however, since under a current load they result in instabilities in the form of so-called "hot spots". Moreover, said inhomogeneities have an adverse effect on the mechanical properties of moldings, for example rods.
2. Owing to the low melting temperatures, the melt is so viscous and after casting solidifies so rapidly, that casting in the form of small cross sections or over longer distances is made considerably more difficult. For example, casting of the melt of the oxides of metals having the molar composition. $Bi_2Sr_2CaCu_2O_x$ with the addition of 9% by weight of $SrSO_4$ in tubular permanent molds having diameters <8 mm is not possible.
3. The melt castings produced from the melt and comprising the oxides of bismuth, strontium, calcium and copper only have a current-carrying capacity (critical current density) in the region of $10^2$ A/cm² and are therefore only conditionally suitable for the technical applications mentioned. This drawback is partially avoided by the addition, as already mentioned, of sulfates of strontium or barium which are admixed to the oxide mixture to be melted. For the first time it was thus possible, in rod-shaped samples with a cross section of 0.12 cm², to achieve current densities of more than 1000 A/cm².

Systematic studies on rod-shaped samples, whose dimensions are large enough to be industrially relevant (0.5 cm² cross section and 150 mm length) show that the current densities do not yet show the necessary reproducibility which is required of a material used in electrical engineering. Parameters, which in an industrial process are controllable only with difficulty, for example the number of times that the corundum crucibles have been used for producing the melt, play a part. Results of such a series of tests can be seen in the following Table 1.

TABLE 1

Critical current densities of rod samples (8 mm diameter) with $SrSO_4$ addition: produced by casting from corundum crucibles

TABLE 1

Critical current densities of rod samples (8 mm diameter) with $SrSO_4$ addition: produced by casting from corundum crucibles

| Number of castings per crucible | Critical current density [A/cm$^2$] | |
|---|---|---|
| | 3% $SrSO_4$ | 6% $SrSO_4$ |
| 1 | 669 | 889 |
| | 568 | 900 |
| 2 | 607 | 858 |
| | 785 | 558 |
| 3 | 701 | 444 |
| | 837 | 607 |
| 4 | 680 | 382 |
| | 465 | 425 |
| 5 | 285 | 393 |
| | 640 | 680 |

From a newly manufactured crucible in each case, melts with additions of 3% or 6% of $SrSO_4$ were cast from one to five times. Each experiment was carried out in duplicate, and the critical current densities were determined subsequently. Table 1 shows that the absolute values of the critical current densities decrease with the number of castings from the same crucible in each case, the fluctuations between the individual samples increasing at the same time.

Other ceramic materials such as stabilized zirconium oxide or densely sintered magnesium oxide are likewise unsuitable as crucible materials, because the comparatively low temperature change stabilities of said materials do not allow the process to be carried out in the described manner.

Although crucibles of nickel or densely sintered aluminum nitride have a sufficiently high temperature change stability, they are so heavily subject to corrosion by the melt that they are completely unsuitable.

The object of the present invention therefore is to modify the existing process so as to overcome the drawbacks and limitations mentioned.

Surprisingly it has now been found that the critical current densities in the solid parts (moldings) are increased substantially if the initial mixture is melted in a platinum crucible. This observation contrasts with a recent study in the literature, which describes the production of superconducting material of the composition $Bi_2Sr_2CaCu_2O_8$ from glassy precursors, which were generated by rapid solidification of melts (T. G. Holesinger et al, Manuscript submitted to Journal of Materials Research, Feb. 7, 1992). The authors, when using corundum and platinum crucibles, do not find any differences in the superconducting material. Critical current densities of fused ceramic samples, comprising the oxides of Bi, Sr, Ca and Cu and optionally of Pb, are typically in the region of $10^2$ A/cm$^2$. If the same material (i.e. similarly without admixture of sulfate) is melted in a platinum crucible, it was possible to achieve, under otherwise identical conditions (identical temperature treatments, identical material cross section of 0.5 cm$^2$) distinctly higher values of up to 1100 A/cm$^2$.

If the critical current densities of different ceramic samples are compared directly, it should be noted that identical cross sections should be compared with one another, since for larger cross sections the self-magnetic field of the samples also increases.

For otherwise identical material properties this results in a reduction of the critical current densities for larger cross sections. The self-field effect also increases with the current flowing through the sample, i.e. it becomes more significant for a material with a higher current-carrying capacity.

For example, in a rod-shaped sample with a length of 60 mm and a cross section of 0 5 cm$^2$ which was produced by fusing in a platinum crucible and by casting in a quartz tube, the critical current was determined at 865 A/cm$^2$. In contrast, in rods with a cross section of 0 05 cm$^2$, which were subsequently sawed longitudinally from this sample, 2200 A/cm$^2$ could be measured reproducibly. When stating critical current densities, the cross sections of the samples in which these current densities were measured should always be stated at the same time.

The self-field effect, however, does not only depend on the absolute cross section of the sample, but also on the geometry of this cross section. For example, it is better to use tubular parts instead of rod-shaped solid parts.

Even upon melting in the platinum crucible, the desired critical current densities could not be achieved in a satisfactorily reproducible manner. Surprisingly it was found, however, that even higher absolute values and improved reproducibility can be achieved if two measures are taken at the same time: melting in the platinum crucible and the addition of $SrSO_4$ or $BaSO_4$. The combination of the two measures made it possible for the first time to achieve current densities of 1400 A/cm$^2$ in fully solid rods with a diameter of 8 mm.

Table 2 lists current densities which were achieved in rods with the composition $Bi_2Sr_2CaCu_2O_x$ (diameter 8 mm, length 120 mm) with various sulfate contents.

TABLE 2

Effect of strontium sulfate content on critical current densities (jc) in casting from platinum crucibles

| Addition $SrSO_4$ [% weight] | 0 | 1 | 3 | 6 | 9 | 15 |
|---|---|---|---|---|---|---|
| jc [A/cm$^2$] | 658 | 658 | 753 | 921 | 945 | 1178 |
| | 732 | 763 | 878 | 951 | 1072 | 1283 |
| | 764 | 826 | 889 | 1046 | 1109 | 1317 |
| | 816 | 881 | 962 | 1046 | 1146 | 1380 |
| | 1107 | 941 | 1066 | 1167 | 1274 | 1420 |

In each case, 5 samples were investigated, and the measured values were listed in ascending order.

Moreover, the service lives of the platinum crucibles, compared to the corundum crucibles, are considerably longer. Even after 20 castings from a platinum cup the latter did not show any visible damage. Instead of carrying out the process described using crucibles of laboratory ware platinum, it is also possible to use crucibles of Pt/Ir 97/3 or 90/10 or Pt/Au 95/5 or Pt/Rh 90/10 or 80/20. Crucible-shaped vessels of pure iridium are also suitable.

It was further found, surprisingly, that melts produced in platinum crucibles can be cast into tubular permanent molds having thinner cross sections. It is assumed, therefore, that the consistency of the melts is affected by the not inconsiderable Al contents.

Moreover, if said crucible materials of noble metals are used, the melting temperatures can be increased considerably. This is particularly desirable if the additives of $SrSO_4$ or $BaSO_4$, which have comparatively high melting points between 1500° and 1600° C., are added in relatively large proportions. The temperature used then only depends on the upsetting point of the platinum metal used as the crucible material in that particular case.

In particular, the process of the invention now comprises intimately mixing the oxides of bismuth, strontium, calcium, copper and optionally of lead in the desired molar ratio, as well as additionally from 2 to 30% by weight of strontium sulfate and/or from 1 to 20% by weight of barium sulfate, each calculated on the basis of the mixture of the oxides, melting the mixture in a crucible of a platinum metal at temperatures from 870° to 1600° C., pouring the melt into permanent molds of desired form and size and allowing it to solidify slowly therein, and freeing the moldings produced from the permanent mold material and annealing them for from 6 to 200 hours at temperatures from 700° to 900° C. in an oxygen-containing atmosphere.

In addition, the process according to the invention may optionally or preferably also be characterized in that a) the crucible material comprises platinum, iridium, rhodium or their alloys with each other or with other noble metals of the 1st or 8th subgroup of the Periodic Table of the Elements;

b) the melt is poured into a horizontally disposed, rapidly rotating tubular permanent mold;

c) the oxide mixture has the composition $Bi_{2-a+b+c}Pb_a(Sr,Ca)_{3-b-c}Cu_{2+d}O_x$, with $a=0$ to 0.7; $b+c=0$ to 0.5, $d=-0.1$ to $+0.1$; $x=7$ to 10, and a molar ratio of $Sr:Ca=(2.8:1)$ to $(1:2.8)$;

d) the mixture is melted at temperatures from 1000° to 1300° C;

e) the moldings are annealed at from 750° to 870° C. in an oxygen-containing atmosphere.

EXAMPLE 1 (COMPARATIVE EXAMPLE)

A mixture of the oxides of bismuth, strontium, calcium and copper, in a molar ratio of the metals of 2:2:1:2 was fused at 1030° C. in sintered corundum crucibles and cast into tubular quartz permanent molds having a diameter of 8 mm and a length of 150 mm, which at their upper end were widened like a funnel. Prior to this, annularly bent silver sheet strips were placed in the permanent molds at their upper and lower ends, through which strips the melt was poured so that they were subsequently firmly integrated in the solidified melt. After annealing, for 60 h at 750° C. and for 60 h and 850° C. respectively, under air, the material was superconducting and the sheet strips were joined to the superconductor in such a way that they were effective as current contacts having especially low contact resistances. The critical current densities were determined on more than 10 of said rods. The values ranged from 38 to 195 $A/cm^2$.

EXAMPLE 2 (COMPARATIVE EXAMPLE)

In contrast to Example 1, the oxide mixture to be melted was admixed with 3% by weight of $SrSO_4$, and more than thirty rods were produced. The critical current densities on average were approximately 500 $A/cm^2$ but ranged from 250 to 900 $A/cm^2$.

EXAMPLE 3 (COMPARATIVE EXAMPLE)

In contrast to Example 1, the metal oxides were fused in crucibles of Pt/Ir 97/3 at 1050° C. and rod-shaped solid parts with current contacts were produced. The critical current densities were determined on ten samples with a length of 150 mm. The values were between 450 and 1100 $A/cm^2$.

EXAMPLE 4

In contrast to Example 3, the oxide mixture was admixed with 3% by weight of $SrSO_4$. The current densities, determined on nine samples, were from 750 to 1170 $A/cm^2$.

EXAMPLE 5

In contrast to Example 3, 9% by weight of $SrSO_4$ were used as an additive. The melting temperature was 1050° C. The current densities measured on seven samples were between 920 and 1274 $A/cm^2$.

EXAMPLE 6

In contrast to Example 3, 15% by weight of $SrSO_4$ were admixed. Thus it was possible on several occasions, in solid rods having a diameter of 8 mm, to achieve critical current densities in the range of 1400 $A/cm^2$.

EXAMPLE 7

In contrast to Example 3, 8% by weight of $BaSO_4$ were used as an additive in each case. On five samples, critical current densities between 700 and 900 $A/cm^2$ were measured.

EXAMPLE 8 (TO DEMONSTRATE THE SELF-FIELD EFFECT)

According to Example 4, a sample having a length of 60 mm and a diameter of 8 mm was produced, in which the critical current density was determined as 865 $A/cm^2$. Both from the surface and from the interior of this sample, rods having a cross section of approximately 0.05 $cm^2$ were cut out over the whole length. The critical current densities measured on four rods cut out from the inner and outer section were between 2150 and 2230 $A/cm^2$.

EXAMPLE 9

A mixture having the composition according to Example 2 was fused in a cup of laboratory ware platinum and via a sloping channel, was poured into a horizontally positioned permanent mold, which had a diameter of 35 mm and a length of 200 mm and which rotated at 800 rpm. Prior to this, silver sheet strips, which after annealing functioned as current contacts, were mounted in the permanent mold. The critical current density in the tube was 2050 A with a material cross section of 3 $cm^2$ ($jc=683$ $A/cm^2$).

EXAMPLE 10

Mixtures having the composition of Example 5 were fused in crucibles of apparatus grade platinum and corundum at 1080° C. in each case, and the attempt was made to cast the melt into quartz tubes, which had funnel-like widened orifices with diameters of 5, 6, 7 and 8 mm. In this experiment it was found that from the material fused in the platinum crucible rods with a length of 120 mm could be obtained in each case, while in the case of the material fused in corundum, only rods with a diameter of 8 mm could be obtained, because the melt was considerably more viscous.

We claim:

1. A process for producing a high-temperature superconductor molding consisting essentially of an oxide comprising bismuth, strontium, calcium, copper and optionally lead as well as sulfates of strontium, barium or mixtures thereof, which comprises:

intimately mixing
- (i) oxides of bismuth, strontium, calcium, copper and optionally of lead in a desired molar ratio, and (ii) from 2 to 30% by weight of strontium sulfate and/or from 1 to 20% by weight of barium sulfate, each calculated according to the mixture of the oxides;

melting the mixture in a crucible comprising crucible material of platinum, iridium, rhodium or their alloys with each other or with other noble metals of the 1st or 8th subgroup of the Periodic Table of the Elements at temperatures from 870° to 1600° C.;

pouring the melt into a permanent mold of desired form and size;

allowing said melt to solidify slowly therein to produce said molding;

freeing the molding from the permanent mold material; and annealing the molding for from 6 to 200 hours at temperatures from 700° to 900° C. in an oxygen-containing atmosphere to produce said high-temperature superconductor molding.

2. The process as claimed in claim 1, wherein the melt is poured into a horizontally disposed, rapidly rotating tubular permanent mold.

3. The process as claimed in claim 1, wherein the mixture is melted at temperatures from 1000° to 1300° C.

4. The process as claimed in claim 1, wherein the molding is annealed at from 750° to 870° C. in an oxygen-containing atmosphere.

5. The process as claimed in claim 1, wherein the high temperature superconductor molding has the composition $Bi_{2-a+b+c}Pb_a(Sr,Ca)_{3-b-c}Cu_{2+d}O_x$, with $a=0.7$; $b+c=0$ to $0.5$, $d=-0.1$ to $+0.1$; $x=7$ to $10$, and a molar ratio of $Sr:Ca=(2.8:1)$ to $(1:2.8)$.

* * * * *